United States Patent [19]

Farwell et al.

[11] Patent Number: 5,233,161
[45] Date of Patent: Aug. 3, 1993

[54] METHOD FOR SELF REGULATING CMOS DIGITAL MICROCIRCUIT BURN-IN WITHOUT OVENS

[75] Inventors: William D. Farwell, Thousand Oaks; Bradley S. Henson, Lakewood, both of Calif.

[73] Assignee: Hughes Aircraft Company, Los Angeles, Calif.

[21] Appl. No.: 785,733

[22] Filed: Oct. 31, 1991

[51] Int. Cl.[5] .......................... G01R 31/28; H05B 1/00
[52] U.S. Cl. .................................. 219/209; 324/158 F
[58] Field of Search ............................... 219/209–210; 324/158 F

[56] References Cited

U.S. PATENT DOCUMENTS

| 3,659,199 | 4/1972 | Knutson | 324/158 D |
| 4,497,998 | 2/1985 | West | 219/209 |

FOREIGN PATENT DOCUMENTS

| 59-11661 | 1/1984 | Japan . |
| 61-96479 | 5/1986 | Japan . |
| 01-298733 | 12/1989 | Japan . |
| 1250997 | 8/1986 | U.S.S.R. . |

OTHER PUBLICATIONS

IBM Technical Disclosure Bulletin, vol. 25, No. 7B, Dec. 1982, "Self–Heating Test Chip for Reliability Life Test".
IBM Technical Disclosure Bulletin, vol. 14, No. 6, Nov. 1971, "Self–Contained Chip Heater".

Primary Examiner—Bruce A. Reynolds
Assistant Examiner—John A. Jeffery
Attorney, Agent, or Firm—L. A. Alkov; W. K. Denson-Low

[57] ABSTRACT

A burn-in heating circuit for an integrated circuit including a burn-in clock generator for producing a burn-in clock signal that is provided to the clock buffer of the clock distribution system of the integrated circuit. The operating frequency of the burn-in clock is at or close to the maximum frequency that the clock distribution system can reliably sustain with valid logic levels, so that the highest possible self-heating can be achieved by power dissipation in the clock distribution system. A comparator that is responsive to a temperature signal representative of the integrated circuit junction temperature and a signal indicative of the desired burn-in temperature modulates the clock generator so that the junction temperature of the integrated circuit resulting from self heating is close to the desired burn-in temperature.

6 Claims, 2 Drawing Sheets

METHOD FOR SELF REGULATING CMOS DIGITAL MICROCIRCUIT BURN-IN WITHOUT OVENS

BACKGROUND OF THE INVENTION

The subject invention is directed generally to circuit testing, and more particularly to test circuitry for burn-in testing without the use of burn-in ovens and which is self-regulating as to burn-in temperature.

As is well known, integrated circuits exhibit most failures during early life and at the end of their useful life. Thus, integrated circuits tend to be most reliable between early life and the end of useful life. Many, if not most, integrated circuit early life failures can be accelerated by increased temperature. Accordingly, integrated circuits utilized in high reliability and military systems are commonly subjected to burn-in testing wherein an integrated circuit is placed in a burn-in oven that produces an in-oven ambient temperature that is intended to achieve a desired chip junction temperature. For example, for Military Specifications, junction temperature is required to be at least 125 degrees Celsius for 160 hours. Temperatures higher than 125 degrees Celsius may be selected with correspondingly reduced burn-in time. Burn-in junction temperature can therefore be selected to be between 125 degrees Celsius the device maximum temperature, with the increased temperature being traded against burn-in time.

During burn-in testing, the integrated circuit under test is powered (i.e., power is applied to the supply pins of the integrated circuit), and sometimes is operated (i.e., the integrated circuit under test is operated in its intended modes of operation). The former type of testing (power only) is referred to as static burn-in testing, and the latter (power and operation) is referred to as dynamic burn-in testing.

An important consideration with conventional burn-in testing is the control of burn-in temperature of the integrated circuits being tested by control of the oven ambient temperature. Maintaining a specified chip junction temperature is extremely difficult due to lack of knowledge of the specific characteristics of the thermal environment (ambient-to-package heat transfer and case-to-junction heat transfer), and lack of knowledge of the precise chip power dissipation during the burn-in process. Thus, conventional burn-in testing can result in under-screening by temperatures that are too low, or in overstress of the integrated circuit by temperatures that are too high.

Further considerations with conventional burn-in testing include the cost of burn-in ovens and their attendant complexity, and the inability to test an entire system which includes integrated circuits having different burn-in temperature requirements.

SUMMARY OF THE INVENTION

It would therefore be an advantage to provide circuitry for precisely controlling burn-in temperature of integrated circuits.

Another advantage would be to provide circuitry for achieving burn-in testing without a burn-in oven.

The foregoing and other advantages are provided by the invention in a burn-in heating circuit that includes a burn-in clock generator for producing a burn-in clock signal that is provided to the clock buffer of the clock distribution system of the integrated circuit. The burn-in clock signal has a frequency that causes the junction temperature of the integrated circuit to increase to at least a predetermined temperature pursuant to power dissipation in the integrated circuit clock distribution system. A comparator that is responsive to a temperature signal representative of the integrated circuit junction temperature and a signal indicative of the desired burn-in temperature modulates the clock generator so that the junction temperature of the integrated circuit resulting from self heating is close to the desired burn-in temperature.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
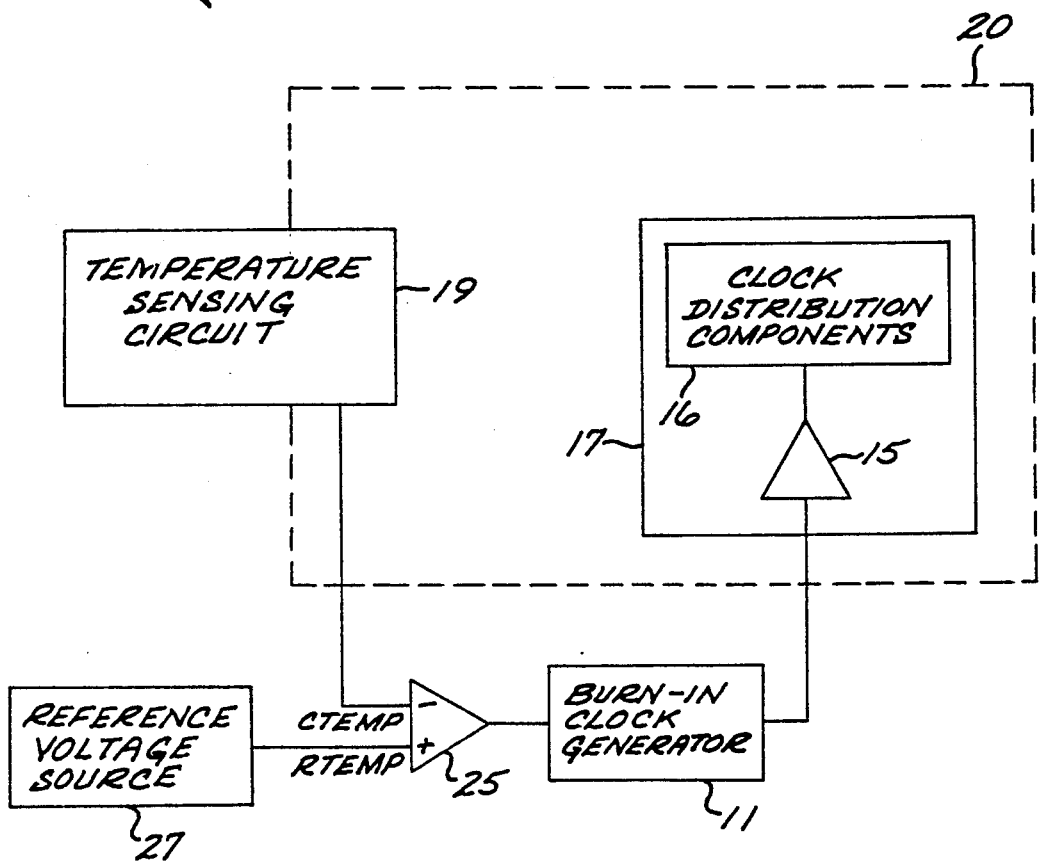
FIG. 1 is a schematic block diagram of a burn-in heating circuit in accordance with the invention.

In the following detailed description and in the several figures of the drawing, like elements ar identified with like reference numerals.

The subject invention is generally directed to burn-in heating circuitry that enables an integrated circuit to be heated for burn-in testing, without a burn-in oven, pursuant to power dissipation in the internal clock signal distribution system that is integral to the integrated circuit. The components of the burn-in heating circuitry can be internal to the integrated circuit (herein "on-chip"), or external to the integrated circuit (herein "off-chip"), with only an integrated circuit junction temperature sensor being required to be on-chip. However, as discussed more fully herein, incorporation of other components of the burn-in heating circuit into the integrated circuit provides for additional advantages.

Referring now to FIG. 1, schematically depicted therein is a heating circuit 10 for a subject integrated circuit 20 that includes a clock distribution system 17 which is conventionally included in digital integrated circuits. The components of heating circuit 10 that are shown outside the box that represents the integrated circuit 20 can be on-chip or off-chip, depending upon implementations. The burn-in heating circuit 10 includes a temperature sensing circuit 19 which is shown as being both on-chip and off-chip since it includes a temperature sensing component that must be on-chip, and which is the only component of the burn-in heating circuit that must be on-chip. The remaining components of the temperature sensing circuit can be off-chip, as described more fully herein.

The heating circuit 10 more particularly includes a burn-in clock generator 11 that generates a burn-in clock signal BCLK that is provided to the clock distribution system 17 of the integrated circuit. The clock distribution system 17 includes a clock buffer 15 and clock distribution components 16 that are conventionally included in digital integrated circuits. Preferably, the frequency of the burn-in clock is selected to be the maximum frequency that the clock distribution system 17 can reliably sustain with valid logic levels, or close to the maximum sustainable frequency. In this manner, the highest possible self-heating can be achieved by power dissipation in the clock distribution system, which ensures that the desired burn-in junction temperature can be produced with such self-heating.

The heating circuit 10 further includes the temperature sensing circuit 19 which provides an output voltage CTEMP that is indicative of the junction temperature of the integrated circuit. By way of illustrative example, the temperature sensing circuit 19 is a temperature dependent voltage source that provides a temperature signal CTEMP which changes substantially linearly with the junction temperature of the integrated circuit. By way of particular example, the temperature sensing circuit 19 can include an on-chip temperature sensing diode and a constant current source, which can be on-chip or off-chip, for providing a constant current forward bias on the temperature sensing. A diode that is forward biased with a constant current source exhibits a forward voltage drop that increases linearly with increasing junction temperature. Thus, the forward voltage drop of an on-chip temperature sensing diode provides a signal that is indicative of the junction temperature of the integrated circuit.

Figure 2A:
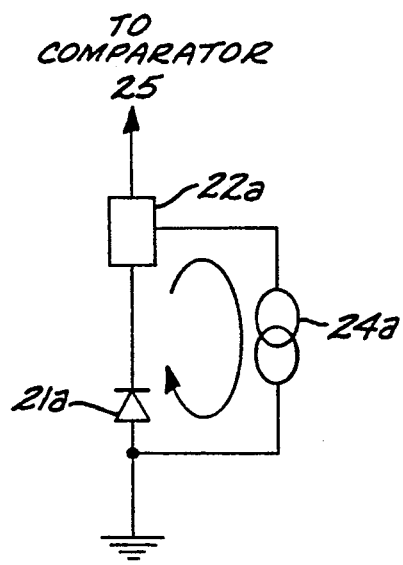
FIGS 2A and 2B schematically depict illustrative examples of temperature sensing circuitry of the burn-in heating circuit of FIG. 1.
Figure 2B:
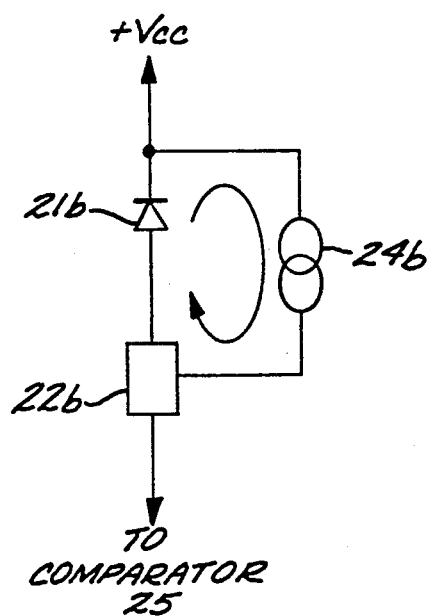
Figure 3:
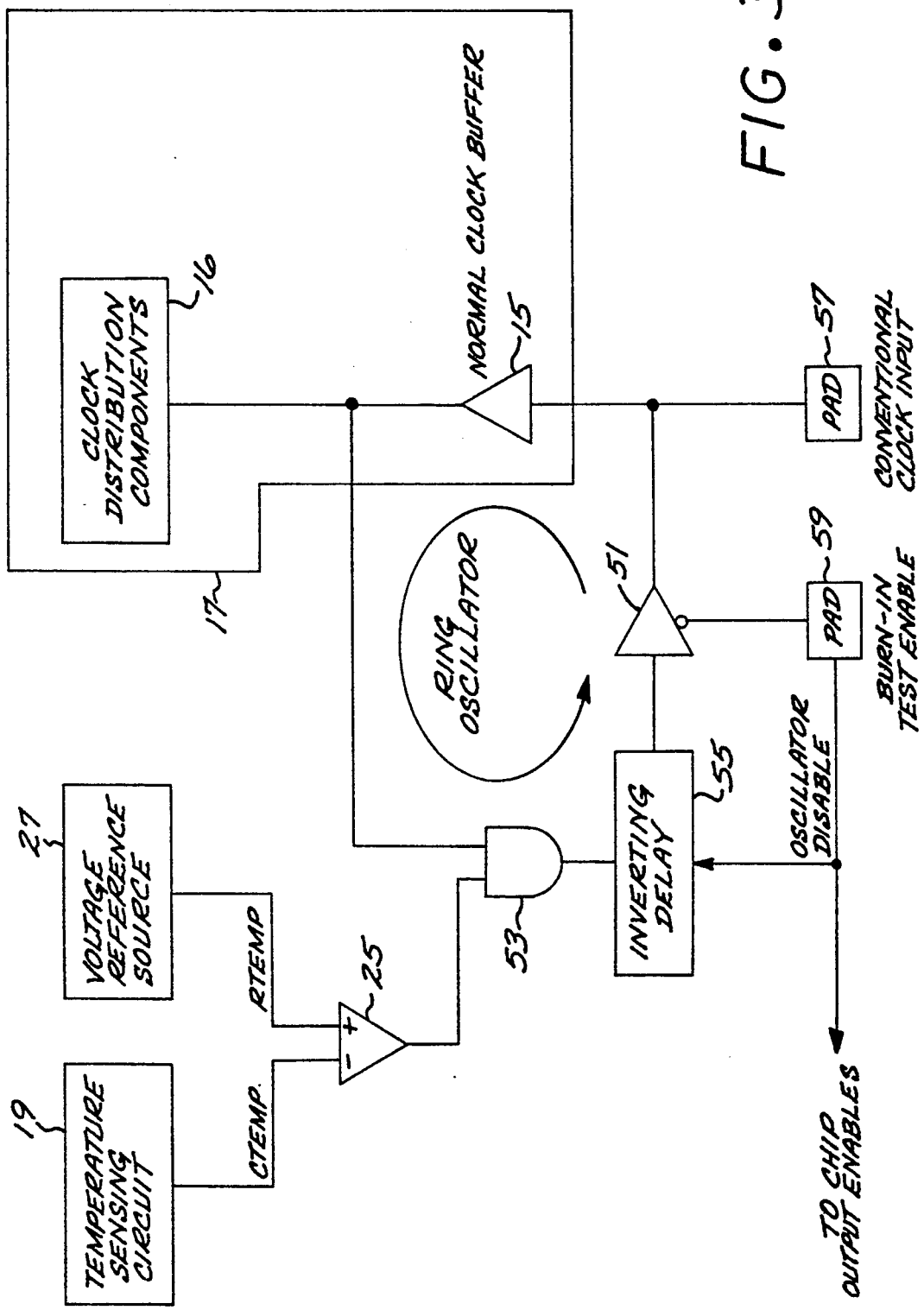
FIG. 3 is a schematic block diagram of a burn-in heating circuit of the invention which includes an on chip burn-in clock generator.

The temperature sensing diode 21 can be one of the clamping diodes that are conventionally included for inputs or outputs of integrated circuits. As shown in FIG. 2A, the voltage CTEMP would be sourced at the cathode of a clamping diode 21a which has its anode connected to chip ground and its cathode connected to an associated input or output pad 22a. For burn-in temperature sensing, the clamping diode 21a is forward biased by a current source 24a which can be on-chip or off-chip. FIG. 2B illustrates that the voltage CTEMP would be sourced at the anode of a clamping diode 21b which has its cathode connected to the chip supply voltage $V_{cc}$ and its anode connected to an associated input or output pad 22b. For burn-in temperature sensing, the clamping diode 21b is forward biased by a current source 24b which can be on-chip or off-chip.

The temperature sensing circuit voltage output CTEMP is provided as one input to a voltage comparator 25 which controls the on/off state of the burn-in clock generator 11. The other input to the voltage comparator 25 is a reference voltage RTEMP which is indicative of the desired burn-in junction temperature. The reference voltage RTEMP is provided by a temperature reference source 27, which can be on-chip or off-chip, and comprises a stable, presettable reference voltage source, which can be externally programmable for different voltages if desired. For example, one of commonly available voltage references based on semiconductor band-gap voltages can be utilized.

For burn-in heating, the burn-in clock generator 11 is enabled, and the integrated circuit is heated pursuant to power dissipation in its internal clock distribution system. The integrated circuit junction temperature will increase until the junction temperature as represented by the temperature signal CTEMP reaches the desired burn-in temperature as represented by the reference voltage RTEMP. The burn-in clock generator will then be disabled until the junction temperature decreases below the reference temperature, at which time burn-in clock generator would be enabled. The controlled enabling and disabling of the burn-in clock generator thus continues so as to maintain the junction temperature as represented by CTEMP close to the reference temperature as represented by RTEMP. In accordance with conventional designs, the voltage comparator can have hysteresis on its inputs avoid erratic enable/disable cycling of the burn-in clock generator. Thus, for example, depending upon implementation, the temperatures at which the clock generator is disabled and then reenabled can be above and below the reference temperature RTEMP within an appropriate range.

Effectively, the burn-in heating circuit modulates the burn-in clock signal BCLK by controlling the duty cycle of the burn-in clock signal in order to maintain the integrated circuit junction temperature close the desired burn-in temperature, where duty cycle refers to the percentage of time during which the burn-in clock generator is on.

By way of illustrative example, if the burn-in clock generator 11 and the temperature comparator 13 are off chip and an input diode in an integrated circuit is utilized for temperature sensing with an off-chip constant current source, the invention can be utilized for burn-in of any CMOS VLSI integrated circuit with no design changes thereto.

By way of further example, if the burn-in clock generator 11 and the voltage comparator 25 are implemented on-chip, and the temperature dependent voltage source comprising the temperature sensing circuit is implemented with on-chip and off-chip components, then self-contained burn-in is possible at any level of assembly of integrated circuits having such components on chip, with a minimum of supporting equipment.

While the heating circuit 10 has been described in the context of controlling burn-in temperature in a thermostat like manner wherein a fixed frequency clock signal is selectively enabled, it should be appreciated that burn-in temperature can be controlled by modulating the frequency of the clock generator so that the chip temperature tends to be the same as the reference temperature. Thus, for example, the burn-in clock generator could comprise a voltage controlled oscillator that is controlled by an appropriate scaled version of the output of the temperature sensing circuit.

Referring now to FIG. 2, schematically depicted therein is a block diagram of a self-contained heating circuit in accordance with the invention that includes a gated ring oscillator as an on-chip burn-in clock generator. The on-chip clock generator includes a two input AND gate 53, a gated inverting delay circuit 55 responsive to the output of the AND gate 53, a gated burn-in clock buffer 51 responsive to output of the inverting delay circuit 55, and the clock buffer 15 of the internal clock distribution system 17 of the integrated circuit. The input of the clock buffer 15 is connected to a conventional clock input pin or pad 57, and also to the output of the burn-in clock buffer 51. The output of the normal clock buffer 15 is provided to the clock distribution components 16 of the integrated circuit clock distribution system 17 and also to the AND gate 53. The other input to the AND gate 53 is provided by a voltage comparator 13 which receives voltage inputs from a temperature sensing circuit 19 and a reference voltage source 27. The voltage comparator 25, the temperature sensing circuit 19, and the reference voltage source 27 are implemented as described above for corresponding components in the burn-in heating circuit of FIG. 1.

The control input of the gated burn-in clock buffer 51 and the control input of the gated inverting delay circuit 55 are connected to an externally accessible burn-in test enable pad 59. The burn-in test enable signal received at the burn-in test enable pad 59 can be advantageously utilized to disable all outputs on the integrated circuit to a benign state (e.g., high impedance for three-state outputs), as indicated on FIG. 2, so that inter-chip contention is avoided during burn-in of assemblies of integrated circuits by use of the invention. By virtue of gating the burn-in clock buffer 51 and the inverting delay circuit 55, the burn-in clock is disabled when the normal clock is operating, which avoids interference between the normal clock and the burn-in clock.

The ring oscillator comprising the inverting delay 55, the burn-in clock buffer 51, the normal clock buffer 15, and the AND gate 53 is configured to have an operating frequency that is the maximum frequency that the clock distribution system can reliably sustain with valid logic levels, or close to the maximum sustainable frequency. In this manner, the highest possible self-heating can be achieved by power dissipation in the clock distribution system, which ensures that the desired burn-in junction temperature can be produced with such self-heating.

The burn-in circuit of FIG. 2 is employed by enabling the burn-in clock buffer 51 and the inverting delay 55, which causes the ring oscillator to drive the clock distribution system at the burn-in clock frequency. The junction temperature of the integrated circuit as represented by the CTEMP output of the temperature sensing circuit 19 will increase until it reaches the desired burn-in temperature as represented by the reference voltage RTEMP provided by the voltage reference source 27, which causes the output of the voltage comparator 25 to transition to a low logic level. The low logic level input to the AND gate 53 disables the burn-in clock generator, which remains disabled until the junction temperature as represented by CTEMP decreases below the reference temperature as represented by RTEMP, at which time output of the voltage comparator would transition to a logical high, causing the burn-in clock generator to be enabled. The controlled enabling and disabling of the burn-in clock generator thus continues so as to maintain the junction temperature as represented by CTEMP close to the reference temperature as represented by RTEMP.

Pursuant to the disclosed invention, precise on-chip temperature measurement is provided by temperature dependent devices, such as clamping diodes normally included in integrated circuit chips. The chip temperature measurement and a suitable temperature reference that is provided on or off chip are utilized by a voltage comparator (also on or off chip) for controlling the duty cycle of a burn-in clock generator which can be on or off chip. The burn-in clocking utilizes clock buffering conventionally included in integrated circuits which eliminates any increase in clock skew and provides for the highest frequency clock that is consistent with the clock distribution system. By utilizing the clock buffer and the clock distribution system that would function in normal operation, quasi dynamic burn-in testing is advantageously achieved as to the clocking components of the integrated circuit. If the clock generator and the temperature comparator are incorporated into integrated circuits, then optimum self-regulating chip burn-in is conveniently enabled by the provision of connections for power, ground, and test enable. In such self-contained implementation, the on-chip burn-in clock is disabled during normal device operation to eliminate potential noise problems associated with asynchronous on chip clock sources.

The foregoing has been a disclosure of burn-in heating circuitry for integrated circuits that provides for burn-in heating without a burn-in oven, precisely controls burn-in temperature, is amenable to varying degrees of incorporation in the integrated circuit to be heated, and can be implemented for use with existing integrated circuits.

Although the foregoing has been a description and illustration of specific embodiments of the invention, various modifications and changes thereto can be made by persons skilled in the art without departing from the scope and spirit of the invention as defined by the following claims.

What is claimed is:

1. A burn-in heating circuit for an integrated circuit having an internal clock distribution system that includes a clock buffer, comprising:

burn-in clock means for producing a fixed frequency burn-in clock signal that is provided to the clock buffer, said fixed frequency selected to cause self-heating such that the junction temperature of the integrated circuit increases to at least a reference temperature;

temperature sensing means for providing a voltage indicative of the junction temperature of the integrated circuit;

reference means for providing a reference voltage indicative of said reference temperature; and control means responsive to said temperature sensing means and said reference means for selectively enabling and disabling said burn-in clock means so that the junction temperature of the integrated circuit is close to said reference temperature.

2. The burn-in heating circuit of claim 1 wherein said burn-in clock means is incorporated in the integrated circuit.

3. The burn-in heating circuit of claim 1 wherein said burn-in clock means comprises a ring oscillator.

4. The burn-in heating circuit of claim 1 wherein said temperature sensing means comprises a temperature dependent voltage source that represents the junction temperature of the integrated circuit, and wherein said reference means is a precision voltage source.

5. The burn-in heating circuit of claim 4 wherein said temperature dependent voltage source includes a diode that is internal to the integrated circuit and biasing means for forward biasing to produce a substantially constant current, whereby the voltage drop across the diode is representative of the junction temperature of the integrated circuit.

6. The burn-in heating circuit of claim 5 wherein said diode comprises a clamping diode connected to an input or output of the integrated circuit.

* * * * *